(12) United States Patent
Yu et al.

(10) Patent No.: US 10,797,125 B2
(45) Date of Patent: Oct. 6, 2020

(54) ELECTRONIC DEVICE HAVING DISPLAY CIRCUITRY WITH ROUNDED CORNERS

(71) Applicant: Apple Inc., Cupertino, CA (US)

(72) Inventors: Cheng-Ho Yu, Milpitas, CA (US); Abbas Jamshidi Roudbari, San Jose, CA (US); Shin-Hung Yeh, Taipei (TW); Sungki Lee, Sunnyvale, CA (US); Ting-Kuo Chang, San Jose, CA (US); Yu Cheng Chen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 81 days.

(21) Appl. No.: 15/985,485

(22) Filed: May 21, 2018

(65) Prior Publication Data

US 2019/0067407 A1    Feb. 28, 2019

Related U.S. Application Data

(60) Provisional application No. 62/552,288, filed on Aug. 30, 2017.

(51) Int. Cl.

| | |
|---|---|
| *H01L 27/32* | (2006.01) |
| *G09G 3/3225* | (2016.01) |
| *H01L 51/52* | (2006.01) |
| *G09G 3/20* | (2006.01) |

(52) U.S. Cl.
CPC ....... *H01L 27/3276* (2013.01); *G09G 3/2092* (2013.01); *G09G 3/3225* (2013.01); *H01L 51/5237* (2013.01); *G09G 2310/0297* (2013.01); *H01L 27/323* (2013.01)

(58) Field of Classification Search
CPC ............... H01L 27/3276; H01L 27/124; H01L 51/5237; H01L 51/5246; G09G 3/2092; G09G 3/3225; G09G 3/20; G09G 3/3688; G09G 3/3291; G09G 3/2007; G09G 3/3233; G09G 3/3275; G09G 3/325
USPC ......................................................... 345/204
See application file for complete search history.

(56) References Cited

U.S. PATENT DOCUMENTS

| | | | | |
|---|---|---|---|---|
| 7,205,972 B1 * | 4/2007 | Kyeong | ............... | G09G 3/3648 345/100 |
| 7,619,602 B2 * | 11/2009 | Shin | ........................ | G09G 3/325 345/100 |
| 7,738,512 B2 * | 6/2010 | Shin | ........................ | G09G 3/325 345/690 |

(Continued)

*Primary Examiner* — Fred Tzeng
(74) *Attorney, Agent, or Firm* — Treyz Law Group, P.C.; G. Victor Treyz; Matthew R. Williams

(57) ABSTRACT

A display may have display driver circuitry. Signal routing lines may supply multiplexed signals from the display driver circuitry to demultiplexer circuitry. The demultiplexer circuitry may provide corresponding demultiplexed signals to the pixels over signal routing lines. The demultiplexer circuitry may have demultiplexer circuit blocks such as 1:N demultiplexer circuit blocks. Each of the demultiplexer circuit blocks may have the same area and layout. The demultiplexer circuit blocks may run across the width of the display. A first portion of the demultiplexer circuit blocks may extend in a straight line parallel to an edge of the active area. A second portion of the demultiplexer circuit blocks may be arranged in a staircase pattern that angles away from the first portion of demultiplexer circuit blocks.

13 Claims, 5 Drawing Sheets

(56) References Cited

U.S. PATENT DOCUMENTS

| | | | |
|---|---|---|---|
| 8,427,442 B2* | 4/2013 | Chang | G06F 3/045 178/18.05 |
| 9,177,500 B2* | 11/2015 | White | G06F 21/84 |
| 9,733,755 B2* | 8/2017 | Yang | G06F 3/0416 |
| 9,753,195 B2 | 9/2017 | de Jong et al. | |
| 10,186,194 B2* | 1/2019 | Fujii | G09G 3/2003 |
| 2005/0117611 A1* | 6/2005 | Shin | G09G 3/325 370/536 |
| 2005/0270258 A1* | 12/2005 | Shin | G09G 3/3275 345/76 |
| 2006/0007768 A1* | 1/2006 | Kim | G09G 3/3291 365/205 |
| 2007/0040770 A1* | 2/2007 | Kim | G09G 3/3233 345/76 |
| 2008/0252588 A1* | 10/2008 | Huang | G09G 3/20 345/100 |
| 2009/0128545 A1* | 5/2009 | Lee | G06F 3/0412 345/214 |
| 2009/0174649 A1* | 7/2009 | Kim | G09G 3/3688 345/104 |
| 2009/0251455 A1* | 10/2009 | Park | G09G 3/2007 345/214 |
| 2011/0227848 A1* | 9/2011 | Furusawa | G06F 1/1626 345/173 |
| 2013/0081756 A1* | 4/2013 | Franklin | B29C 53/04 156/221 |
| 2013/0313528 A1* | 11/2013 | So | H01L 51/5246 257/40 |
| 2014/0139771 A1* | 5/2014 | Choi | G02F 1/13452 349/43 |
| 2015/0109279 A1 | 4/2015 | Gupta et al. | |
| 2015/0145843 A1* | 5/2015 | Park | G09G 3/20 345/209 |
| 2016/0055789 A1 | 2/2016 | Hashimoto | |
| 2016/0293118 A1* | 10/2016 | Park | H01L 27/124 |
| 2017/0192596 A1* | 7/2017 | Lee | G01L 1/146 |
| 2017/0193914 A1 | 7/2017 | Heo et al. | |
| 2018/0182324 A1* | 6/2018 | Lin | G09G 3/3225 |

* cited by examiner

ELECTRONIC DEVICE HAVING DISPLAY CIRCUITRY WITH ROUNDED CORNERS

This application claims the benefit of provisional patent application No. 62/552,288, filed Aug. 30, 2017, which is hereby incorporated by reference herein in its entirety.

BACKGROUND

This relates generally to electronic devices and, more particularly, to electronic devices with displays.

Electronic devices often include displays. For example, devices such as cellular telephones, tablet computers, laptop computers, wristwatch devices, and other devices may have displays.

It can be challenging to incorporate displays into electronic devices. Space is often at a premium, particularly in portable devices. If care it not taken, more area may be consumed by display circuitry than desired.

SUMMARY

An electronic device may have a housing and a display in the housing. An array of pixels may form an active display area that displays images for a user. The display may have an inactive area that contains display driver circuitry and other structures that do not display images. Display driver circuitry may be formed in the inactive area. The display driver circuitry may include one or more display driver integrated circuits. Signal routing lines may supply multiplexed signals such as multiplexed data signals from the display driver circuitry to demultiplexer circuitry.

The demultiplexer circuitry may provide corresponding demultiplexed signals to the pixels in the active area over signal routing lines. The demultiplexer circuitry may have demultiplexer circuit blocks. Each of the demultiplexer circuit blocks may have the same area and layout. The demultiplexer circuit blocks may run in a strip across the width of the display. A first set of the demultiplexer circuit blocks may extend in a straight line parallel to an edge of the active area. A second set of the demultiplexer circuit blocks may be arranged in a staircase pattern forming a line that angles away from the line of the first set of demultiplexer circuit blocks. This arrangement may help relieve signal routing line crowing.

DETAILED DESCRIPTION

Figure 1:
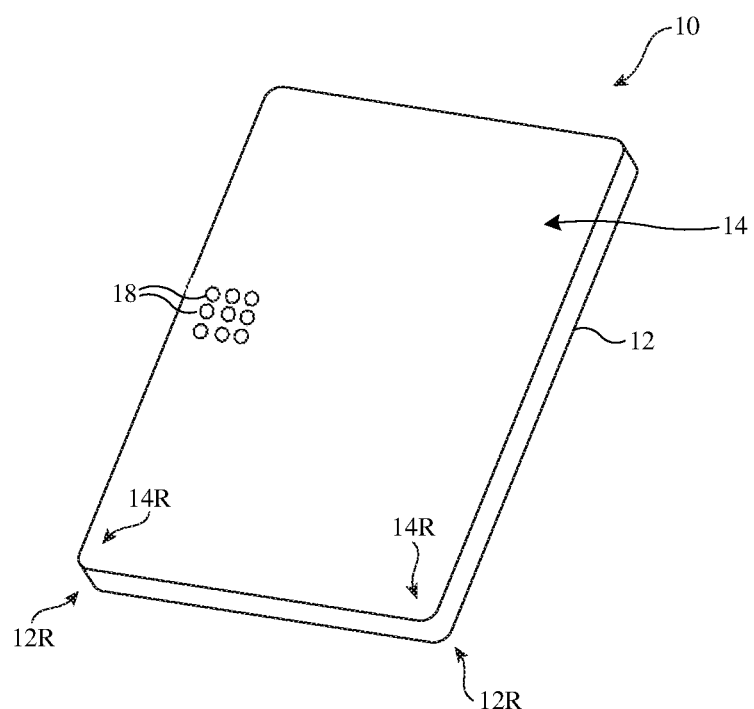
FIG. 1 is a perspective view of an illustrative electronic device in accordance with an embodiment.

An electronic device such as electronic device 10 of FIG. 1 may have a display. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

Device 10 may include a display such as display 14. Display 14 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels 18. Pixels 18 may be arranged in rows and columns in an array that covers most or all of the front face of device 10 (as an example). The array of pixels 18 in device 10 may display images for a user and may therefore sometimes be referred to the active area of display 14. The active area of display 14 may have a rectangular shape with rounded (curved) corners or other suitable shape and may, if desired, be bordered along one or more edges by an inactive border region (e.g., a portion of display 14 that is free of pixels 18 and that does not emit light). In the illustrative configuration of FIG. 1, display 14 has rounded corners 14R to accommodate rounded corners 12R of housing 12.

A display cover layer (e.g., a transparent layer of glass, plastic, or other material with rounded corners) may overlap the active area and the inactive area of display 14. The portion of the display cover layer overlapping pixels 18 of the active area may be free of masking materials to allow users to view images being displayed by the pixels. The portion of the display cover layer that overlaps the inactive area may have an internal coating layer of opaque masking material (e.g., black ink, white ink, gray ink, ink of non-neutral colors, etc.) to help hide display circuitry (integrated circuits, signal lines, etc.) and other inactive area structures from view by a user.

Figure 2:
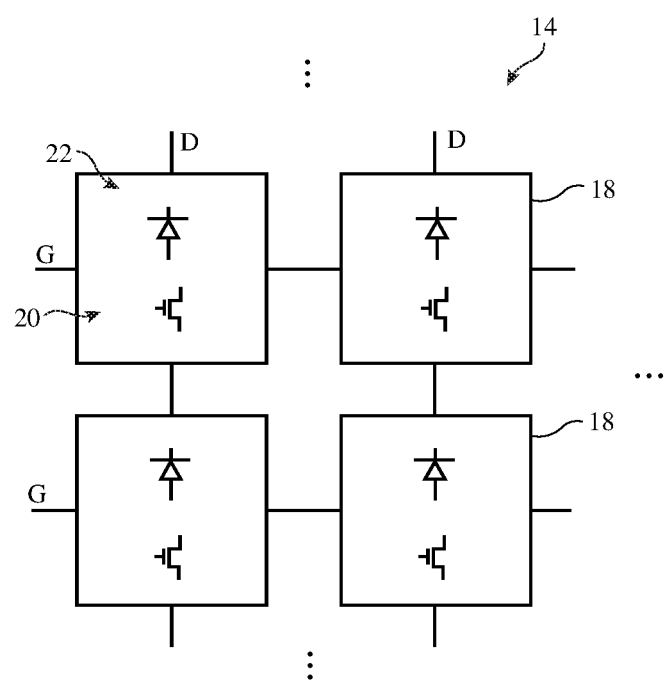
FIG. 2 is a circuit diagram of a portion of an array of pixels in a display in accordance with an embodiment.

Display system 14 may be a liquid crystal display with liquid crystal display pixels, an organic light-emitting diode display with organic light-emitting diode pixels, a display having an array of crystalline semiconductor light-emitting diode dies, and/or displays based on other display technologies. As shown in FIG. 2, each pixel 18 may include circuitry such as transistor(s) 20. Transistors 20 may be, for example, thin-film transistors that are fabricated on a display substrate. Transistors 20 may be used in forming pixel circuitry in each pixel 18. For example, in a light-emitting diode display such as an organic light-emitting diode display, each pixel 18 may include an organic light-emitting diode such as diode 22 that is controlled by corresponding thin-film transistor pixel circuitry formed from one or more transistors 20. The pixel circuitry of each pixel 18 may be configured to receive data on signal lines such a data lines D. One or more control lines G (sometimes referred to as scan lines, emission enable lines, gate lines, etc.) may be used in providing each pixel 18 with control signals. The control signals may be used to control the loading of data into pixels 18. A common set of gate lines G may span each row of pixels 18 and a common data line D may span each column of pixels 18 and/or other arrangements may be used for routing the data and gate lines in display 14. In some configurations, data lines (and/or gates lines) may run horizontally and/or data lines (and/or gate lines) may include both horizontal and/or vertical sections. In the configuration of FIG. 2, data lines D run vertically and at least parts of gate lines G run horizontally. Other arrangements may be used for the gate and data lines in display 14, if desired. The configuration of FIG. 2 is merely illustrative.

Figure 3:
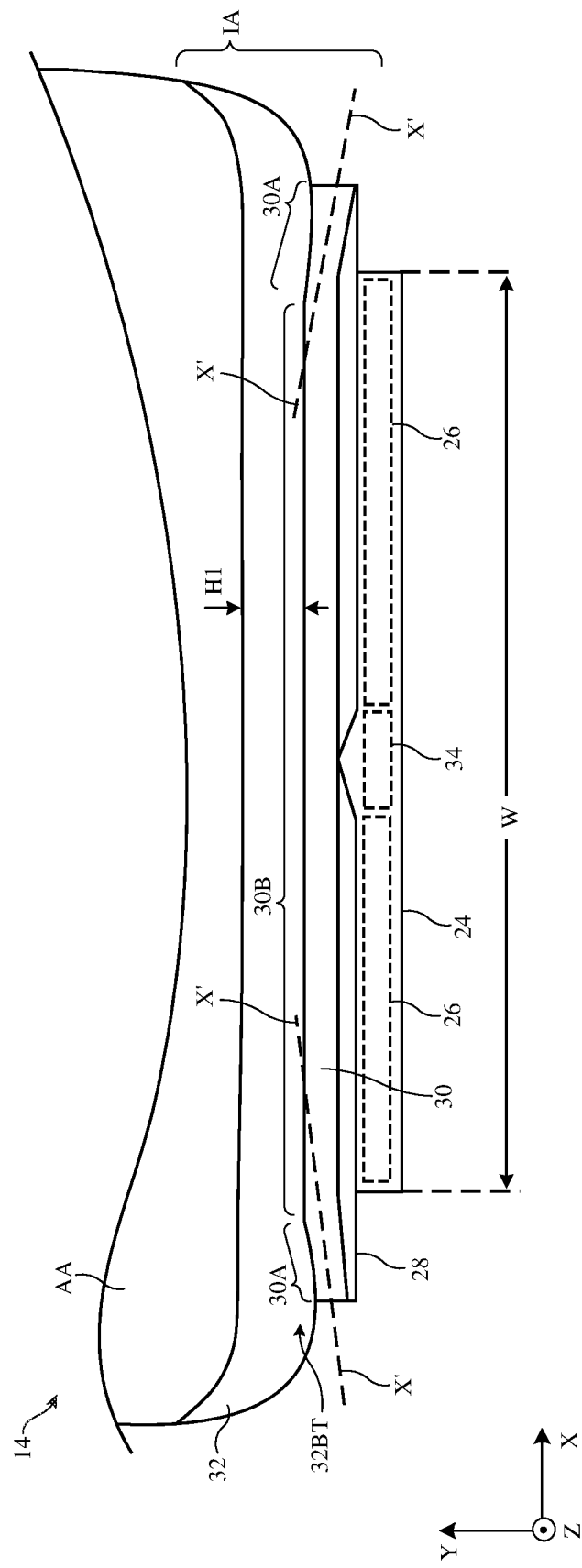
FIG. 3 is a top view of a portion of a display showing an illustrative layout for demultiplexer circuitry and signal lines in an inactive display region and a portion of an associated active display area with rounded corners in accordance with an embodiment.

As shown in FIG. 3, display 14 may include an active area such as active area AA and an inactive area such as inactive area IA. Active area AA has pixels 18 and is configured to display images for a user. Inactive area IA contains display driver circuitry and does not contain pixels.

One or more display driver integrated circuits such as display driver integrated circuit 24 may receive image data from control circuitry such as a microprocessor or other content source in device 10. To display images associated with this image data, display driver circuitry such as display driver integrated circuit 24 may supply data and control signals to pixels 18 (e.g., using signal lines such as data lines D and gate lines G of FIG. 2). The contacts (pads) of integrated circuit 24 may be bonded to signal traces on a substrate associated with display 14 in regions such as illustrative bond pad region 26 (e.g., using solder bonds). Gap 34 in region 26 may be used for registration marks (fiducials), panel identification information, and other information.

Signal routing lines 28 may be used to route ("fan out") the signals from the bond pads in regions 26 to demultiplexer circuitry 30. Demultiplexer circuitry 30 may perform signal demultiplexing operations (e.g., data demultiplexing). For example, demultiplexer circuitry 30 may contain a strip of 1:N demultiplexers that extends across the width of display 14. The value of N may be at least 2, at least 3, 2-5, 2-4, 2-10, less than 5, or other suitable value. In one illustrative configuration, the value of N is 3. Using demultiplexer circuitry 30, M signals on M routing lines 28) may be demultiplexed to produced N*M signals on N*M corresponding signal routing lines 32. Signal routing lines 32 may be used to route (fan out) the demultiplexer output signals that demultiplexer circuitry 30 provides at its output to pixels 18 in active area AA.

In general, display 14 may have any suitable number of pixels, gate lines G, and data lines D, etc. With one illustrative configuration, integrated circuit 24 has about 900 bonding pads for providing about 900 corresponding data signals (e.g., data signals that have not yet been demultiplexed and that are therefore sometimes referred to as multiplexed data signals), demultiplexer circuitry 30 has about 900 corresponding inputs associated with 900 respective 1:3 demultiplexers (sometimes referred to as demultiplexer blocks or demultiplexer circuit blocks). Demultiplexer circuitry 30 demultiplexes the 900 multiplexed data signals and supplies about 2700 corresponding data line signals (sometimes referred to as demultiplexed signals or demultiplexed data line signals) on 2700 corresponding outputs. Data routing lines 32 include about 2700 lines to route the demultiplexed data signals from the outputs of demultiplexer circuitry 30 (e.g., the outputs of the 900 demultiplexer circuits in circuitry 30) to about 2700 corresponding vertical data lines D in display 14 (e.g., a data line D corresponding to each column of pixels 18, etc.). Other amounts of demultiplexing and different fan-out arrangements may be used, if desired.

To avoid creating signal routing line bottlenecks (signal line crowding) in routing lines 32 in regions 32BT on the left and right sides of inactive area IA of display 14, demultiplexer circuit blocks 30A in demultiplexer circuitry 30 may be arranged in a staircase pattern. Demultiplexer circuit blocks 30B in demultiplexer circuitry 30 may extend horizontally in a straight line running parallel to the straight lower edge of active area AA and parallel to the X dimension of FIG. 3, whereas demultiplexer circuit blocks 20A in demultiplexer circuitry 20 may extend in a line that runs diagonally along longitudinal axes X'. Dimensions X and X' may be oriented at a non-zero angle with respect to each other.

Figure 4:
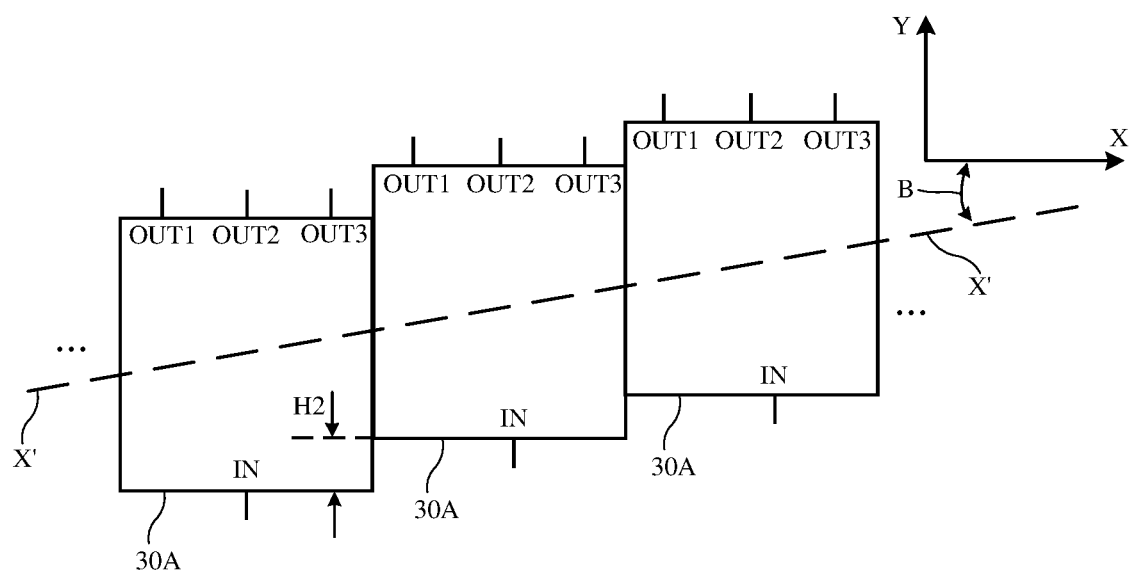
FIG. 4 is a circuit layout diagram showing how some of the demultiplexer circuit blocks in the demultiplexer circuitry may be arranged in a staircase pattern in accordance with an embodiment.

As shown in FIG. 4, for example, demultiplexer circuit blocks 30A may each be offset vertically by a vertical distance H2 (e.g., 0.1 microns to 10 microns, at least 0.05 microns, at least 0.2 microns, at least 0.5 microns, at least 2 microns, at least 5 microns, less than 20 microns, or other suitable amount). With this arrangement, demultiplexer circuit blocks 30A extend in a line along a dimension (axis) X' that is oriented at a non-zero angle B with respect to horizontal dimension (axis) X (e.g., the dimension along which demultiplexer circuit blocks 30B extend in a line). The angle made between the dimension along which blocks 30A extend and the dimension along which blocks 30B extend may be 0.1-10°, 0.5-10°, at least 0.5°, at least 1°, at least 2°, at least 3°, less than 9°, less than 7°, etc. Each circuit block 30A may have transistors that are configured to form switches that selectively route the input of that block 30A (IN) to one of three outputs (OUT1, OUT2, or OUT3) in response to control signals from display driver circuitry integrated circuit 24. In this way, signal bits B1, B2, B3 B4, . . . on input line IN can be routed in sequence so that B1 is presented on OUT1, B2 is presented on OUT2, B3 is presented on OUT3, B4 is presented on OUT1, etc. Because signals are multiplexed between display driver integrated circuit 24 and demultiplexer circuitry 30, a reduced number of signal lines are needed in signal routing lines 28.

Figure 5:
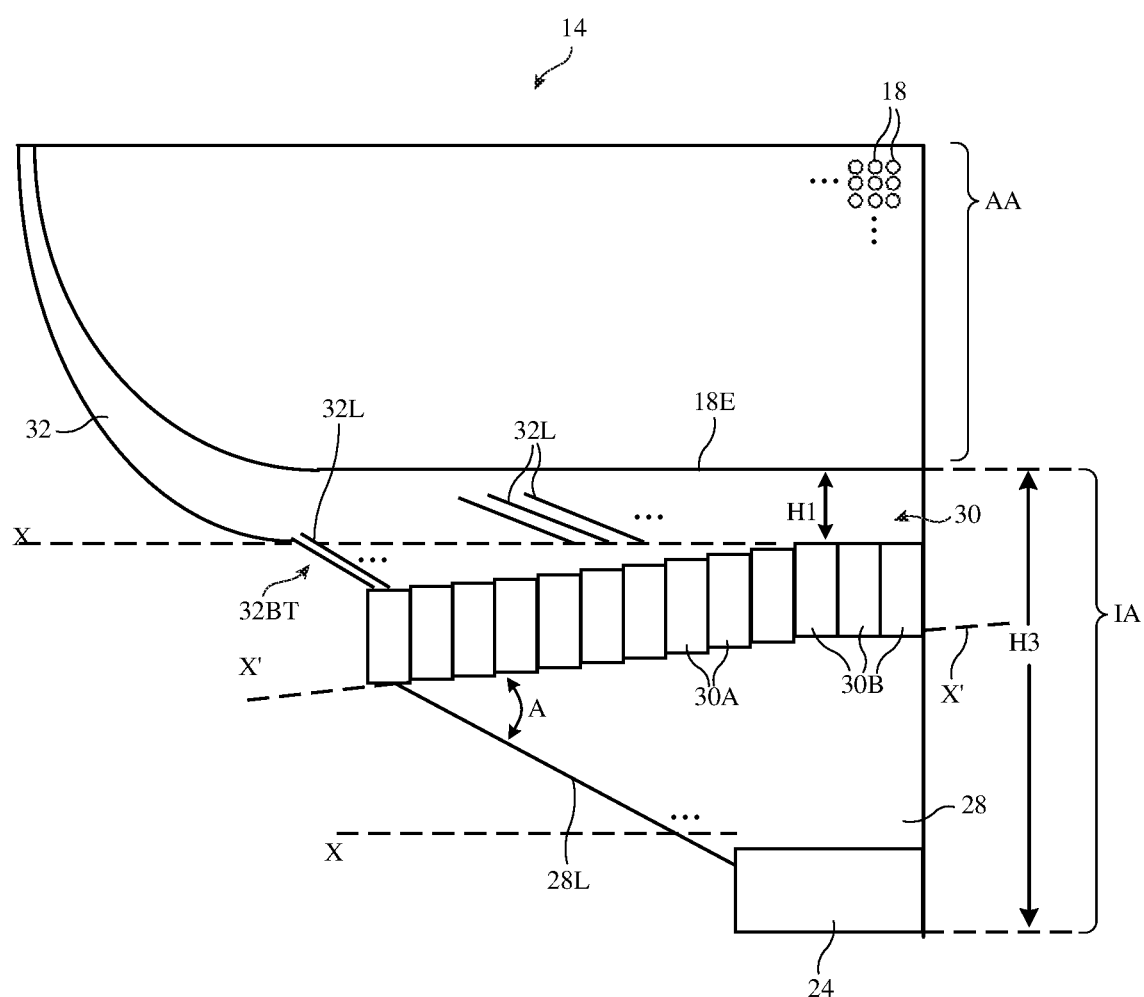
FIG. 5 is a top view of a portion of a display in accordance with an embodiment.

As shown in FIG. 5, because the set of demultiplexer circuit blocks (1:N demultiplexers) 30A extends along an axis X' that is oriented at a non-zero angle B with respect to the horizontal axis (X axis) that runs parallel to lower edge 18E of active area AA along which the set of demultiplexer circuit blocks 30B extends, there is more room for the signal routing lines (see, e.g., lines 32L) in regions 32BT than would be possible if X' were oriented horizontally. This allows height H1 of the region occupied by signal routing lines 28 to be reduced and allows the height H3 of inactive area IA (i.e., the lower inactive border of display 14) to be reduced. The angle A between axis X' and routing lines such as line 28L at the left and right edges of signal routing lines 28 also is increased (becomes less shallow) as a result of the presence of the tilt (staircase) configuration of demultiplexer circuit blocks 30A. This allows the width W of display driver integrated circuitry 24 (e.g., the display driver integrated circuit and bond pad region(s) 26 of FIG. 3) to be reduced (e.g., with a corresponding increase in its height perpendicular to its width) without exceeding design rule constraints on signal routing 28. The use of the tilted line of demultiplexer circuit blocks 30A also reduces the signal routing bottleneck that would otherwise be present at region 32BT and allows height H1 of routing lines 32 to be reduced. Demultiplexer circuit blocks 30A and 30B may, if desired, each be formed using a common (shared) layout so that the size of blocks 30B (e.g., the area consumed on the substrate of display 14) is the same as the size of blocks 30A.

The foregoing is merely illustrative and various modifications can be made to the described embodiments. The foregoing embodiments may be implemented individually or in any combination.

What is claimed is:

1. A display, comprising;
pixels configured to form an active area with rounded corners that displays images;
display driver circuitry; and
demultiplexer circuitry between the display driver circuitry and the pixels, wherein the display driver circuitry conveys signals to the demultiplexer circuitry to display the images and wherein the demultiplexer circuitry has a first portion with first demultiplexers that extend along a first dimension and a second portion with second demultiplexers that extend in a staircase pattern along a second dimension that is oriented at a non-zero angle with respect to the first dimension.

2. The display defined in claim 1 further comprising first and second routing lines, wherein the first routing lines fan out from the display driver circuitry and are configured to provide the signals from the display driver circuitry to the demultiplexer circuitry.

3. The display defined in claim 2 wherein the second routing lines fan out from the demultiplexer circuitry, wherein the demultiplexer circuitry is configured to demultiplex the signals from the display driver circuitry, and wherein the second routing lines are configured to provide the demultiplexed signals from the demultiplexer circuitry to the pixels.

4. The display defined in claim 1 wherein the pixels comprise organic light-emitting diode display pixels.

5. The display defined in claim 1 wherein the non-zero angle has a value of 0.5-10°.

6. The display defined in claim 5 wherein the first and second demultiplexers are 1:N demultiplexers and wherein N has a value of 2-5.

7. The display defined in claim 1 wherein the each of the first demultiplexers and each of the second demultiplexers is a 1:3 demultiplexer.

8. The display defined in claim 1 wherein the first demultiplexers have a first size, wherein the second demultiplexers have a second size, and wherein the first size and the second size are equal.

9. A display, comprising:
pixels configured to form an active area that displays images;
demultiplexer circuitry having a first set of demultiplexer circuit blocks that extend in a straight line along an edge of the active area and having a second set of demultiplexer circuit blocks arranged in a staircase pattern, wherein the second set of demultiplexer circuit blocks is not parallel to the first set of demultiplexer circuit blocks; and
signal lines configured to route demultiplexed signals from the demultiplexer circuitry to the pixels.

10. The display defined in claim 9 further comprising routing lines that route multiplexed signals to the demultiplexer circuitry from at least one integrated circuit.

11. The display defined in claim 10 wherein the integrated circuit comprises a display driver integrated circuit.

12. The display defined in claim 11 wherein the first demultiplexer circuit blocks each have a first area, wherein the second demultiplexer circuit blocks each have a second area, and wherein the first area and the second area are equal.

13. The display defined in claim 12 wherein the active area has at least one rounded corner.

* * * * *